(12) United States Patent
Roth et al.

(10) Patent No.: US 7,990,186 B2
(45) Date of Patent: Aug. 2, 2011

(54) SIGNAL CONDITIONING CIRCUIT WITH A SHARED OSCILLATOR

(75) Inventors: Martin Roth, Starnberg (DE); Mattias Jelen, Munich (DE); Gottfried Holzmann, Zorneding (DE); Albert Moser, Munich (DE); Martin Oetjen, Gruebenzell (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 388 days.

(21) Appl. No.: 12/093,269

(22) PCT Filed: Nov. 6, 2006

(86) PCT No.: PCT/EP2006/010611
§ 371 (c)(1),
(2), (4) Date: Jun. 23, 2008

(87) PCT Pub. No.: WO2007/054253
PCT Pub. Date: May 18, 2007

(65) Prior Publication Data
US 2009/0302896 A1   Dec. 10, 2009

(30) Foreign Application Priority Data
Nov. 10, 2005   (DE) .................. 10 2005 053 723

(51) Int. Cl.
*H03B 21/00* (2006.01)
(52) U.S. Cl. ........ 327/105; 327/106; 327/107; 327/117; 327/119
(58) Field of Classification Search .................. 327/105, 327/117, 119
See application file for complete search history.

(56) References Cited

U.S. PATENT DOCUMENTS

| 4,926,130 A | 5/1990 | Weaver |
| 5,712,628 A * | 1/1998 | Phillips et al. ............. 340/10.51 |

(Continued)

FOREIGN PATENT DOCUMENTS

GB 2337169 A 11/1999
(Continued)

OTHER PUBLICATIONS

Ian Braithwaite; "4GHz sysnthesized local oscillator design"; Electronics & Wireless World; 1988 pp. 251-255.

(Continued)

*Primary Examiner* — Lincoln Donovan
*Assistant Examiner* — John W Poos
(74) *Attorney, Agent, or Firm* — Ditthavong Mori & Steiner, P.C.

(57) ABSTRACT

A circuit for signal conditioning including a first stage with a digital/analog converter, a second stage with an I/Q-modulator, and at least one third stage with a mixer. Instead of a multiplicity of independent oscillators, a shared oscillator is provided for the first, second, and third stages, from an output signal of which a respective oscillator signal and clock-pulse signal for each stage of the first, second, and third stages is derived. The oscillator signal and respective clock-pulse signal of the oscillator are supplied via a frequency divider to at least one stage of the first, second, and third stages, or the oscillator signal of the oscillator is supplied via a frequency multiplier to at least one stage. Also, the oscillator signal of the oscillator is supplied as a reference signal to a frequency synthesizer of at least one stage of the first, second, and third stages.

6 Claims, 3 Drawing Sheets

U.S. PATENT DOCUMENTS

| | | | |
|---|---|---|---|
| 5,784,413 A | 7/1998 | Chen | |
| 6,345,177 B1 | 2/2002 | Renard et al. | |
| 2004/0146161 A1* | 7/2004 | De Jong | 380/255 |
| 2008/0160935 A1* | 7/2008 | Rexberg | 455/114.3 |

FOREIGN PATENT DOCUMENTS

| | | |
|---|---|---|
| WO | 96/39750 | 12/1996 |
| WO | 97/08567 A1 | 3/1997 |
| WO | 01/11797 A1 | 2/2001 |
| WO | 03/007564 A2 | 1/2003 |

OTHER PUBLICATIONS

International Preliminary Report on Patentability, PCT/EP2006/010611, Rohde & Schwarz GmbH & Co. KG, Sep. 4, 2008, pp. 1-6.

* cited by examiner

US 7,990,186 B2

SIGNAL CONDITIONING CIRCUIT WITH A SHARED OSCILLATOR

CROSS-REFERENCE TO RELATED APPLICATION

The present application claims priority to German Patent Application No. 10 2005 053 723.5, filed on Nov. 10, 2005, and PCT Application No. PCT/EP2006/010611, filed on Nov. 6, 2006, the entire contents of which are herein incorporated by reference.

BACKGROUND OF THE INVENTION

Field of the Invention

The invention relates to a circuit for signal conditioning in several stages with a shared oscillator for noise reduction.

Discussion of the Background

In the context of a multi-stage signal conditioning, for example, consisting of a digital/analog converter, an I/Q-modulator and several mixers, the signal/noise ratio deteriorates at each stage. A substantial problem in this context is that the oscillators allocated to the individual stages are realised independently from one another. The phase fluctuations of the individual oscillators and clock-pulse generators are therefore completely un-correlated with one another, so that the overall noise increases because of this lack of correlation.

SUMMARY OF THE INVENTION

The object of the invention is to minimise the phase noise in a circuit for multi-stage signal conditioning.

According to the invention, a single, shared oscillator is used in a multi-stage circuit for signal conditioning with a digital/analog converter, an I/Q-modulator and at least one mixer instead of a multiplicity of oscillators for the individual stages.

As a result, the phase fluctuations are correlated with one another, so that the overall noise is reduced because of this correlation.

BRIEF DESCRIPTION OF THE DRAWINGS

An exemplary embodiment of the invention is described below with reference to the drawings. The drawings are as follows.

DETAILED DESCRIPTION OF EMBODIMENTS OF THE INVENTION

Figure 1:
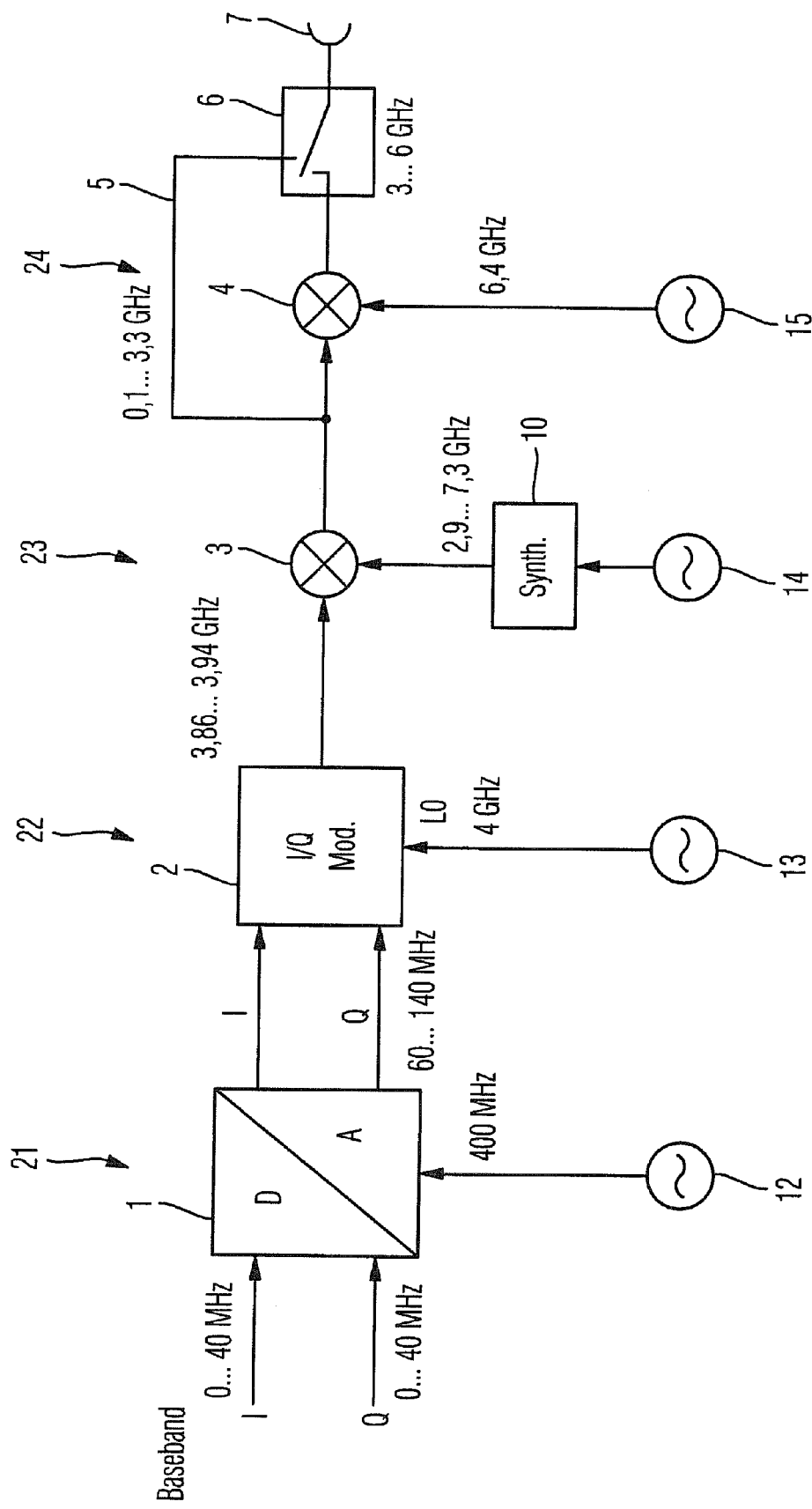
FIG. 1 shows a circuit arrangement for a multi-stage signal conditioning according to the prior art.

The circuit arrangement according to the prior art shown in FIG. 1 comprises several signal-processing stages, the stages being formed by a digital/analog converter 1, an I/Q-modulator 2, the mixers 3 and 4, and a switching unit 5.

The in-phase component (I) and the quadrature component (Q) of a digital baseband signal are supplied to the digital/analog converter 1 via two lines. A clock-pulse signal, which is derived from a first oscillator 12, is supplied to a third input of the digital/analog converter 1. The converted, analog signal is supplied with its I- and Q-components to the inputs of an I/Q-modulator 2. An oscillator signal, which is generated by the second oscillator 13, is supplied to a third input the I/Q-modulator 2.

The I/Q-modulated signal is supplied to the first input of a first mixer 3. A signal with variable frequency, which is derived from a third oscillator 14, is supplied from a synthesiser 10, for example, a PLL (phase-locked loop), to a second input as a reference signal. The signal from the mixer 3 is supplied to a first input of the mixer 4. A signal, which is derived from a fourth oscillator 15, is supplied to a second input of the mixer 4.

The output signal from the second mixer 4 is supplied to a first input of a changeover switch 6. The output signal from the first mixer 3 is supplied to a second input of the changeover switch 6 via a connection 5. The changeover switch 6 is connected to the output 7 of the circuit for signal conditioning.

In the configuration presented, the baseband signal supplied to the digital/analog converter provides a bandwidth from 0 to 40 MHz. This applies respectively for the I-channel and the Q-channel of the baseband signal supplied to the circuit for signal conditioning. A clock-pulse signal of 400 MHz is supplied to the digital/analog converter 1.

Figure 3:
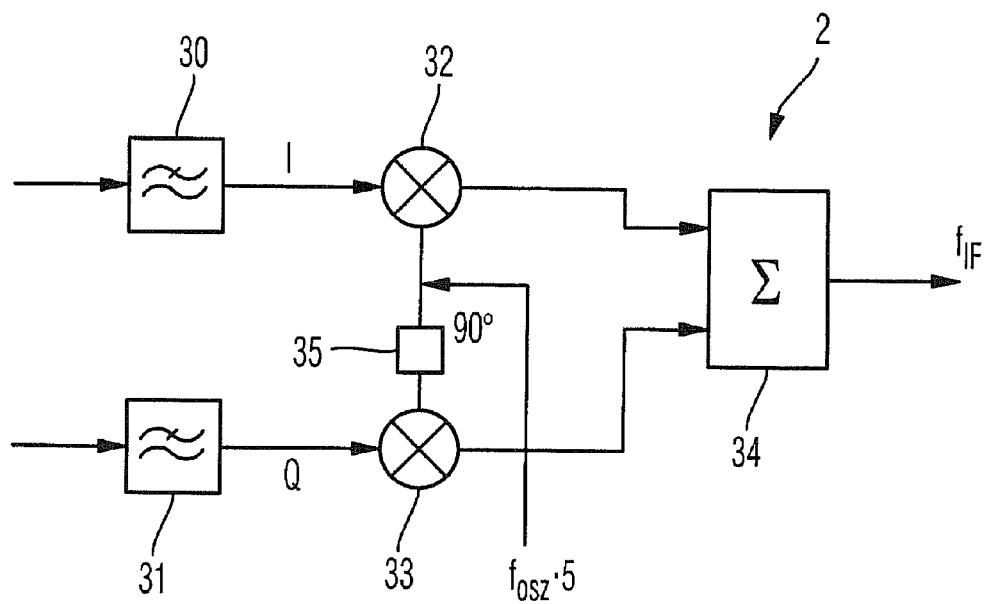
FIG. 3 shows an I/Q-modulator capable of being used within the framework of the invention.

The analog I- and Q-channels at the output of the digital/analog converter 1 are each supplied to the I/Q-modulator 2. After the digital/analog conversion in stage 21, the signal in the embodiment presented in FIG. 3 provides a bandwidth between 60 and 140 MHz. After the I/Q-modulation with the I/Q-modulator 2 in stage 22 and the simultaneous raising to the intermediate frequency range of 4 GHz, the signal is disposed at frequencies of around 3.86 and 3.94 GHz. The signal modulated in this manner is mixed in the first mixer stage 23 by means of the first mixer 3 via a signal or frequency synthesiser 10 into the frequency range from 0.1 to 3.3 GHz. This signal can be connected via a line 5 and the changeover switch 6 directly to the output 7. The signal can be further converted in a further mixer stage 24 with the second mixer 4. In the illustration, an oscillator signal with a frequency of 6.4 GHZ is supplied to the mixer stage 4.

Figure 2:
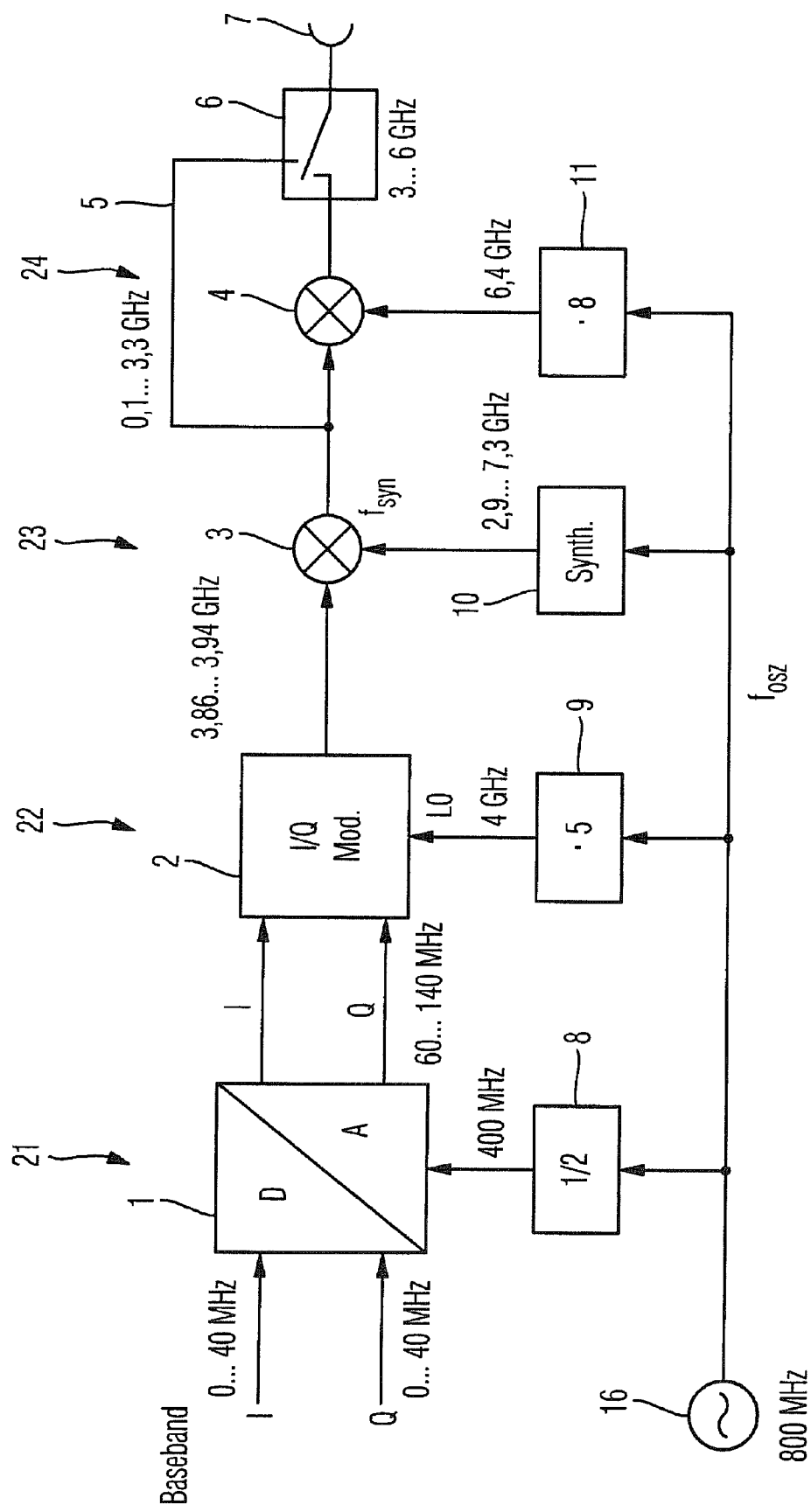
FIG. 2 shows a circuit arrangement for a multi-stage signal conditioning according to the invention.

A modified circuit arrangement according to the invention is presented in FIG. 2. This comprises substantially the same components as the circuit shown in FIG. 1. For ease of reference, the components are indicated with the same reference numbers.

Accordingly, a digital/analog converter 1, an I/Q-modulator 2, the mixers 3 and 4, the connection 5 and a changeover switch 6 are also provided in the circuit arrangement illustrated in FIG. 2. The output signal of the mixer 3 can also be supplied directly via the connection 5 and the changeover switch 6 to the output 7.

The circuit arrangement contains a frequency divider 8, frequency multipliers 9 and 11 and the frequency synthesiser 10. The wiring and function of the components in FIG. 2 is substantially the same as in FIG. 1. However, according to the invention, by way of difference from the circuit according to FIG. 3, the signal from only one shared oscillator 16 is supplied to the respective inputs of the frequency divider 8, the frequency multipliers 9 and 11 and the frequency synthesiser 10.

As a result of the use of this single oscillator 16, of which the signal is supplied to the individual stages 21-24, the phase fluctuations of the oscillator signals provided, and accordingly also of the output signals of the individual stages 21-24, are correlated. The resulting correlation reduces the overall noise of the circuit arrangement by comparison with FIG. 1. The use of a shared oscillator signal from the oscillator 16 is achieved by means of the frequency divider 8 and the frequency multipliers 9 and 11.

By way of explanation of the circuit arrangements for the multi-stage signal conditioning according to the invention as illustrated in FIG. 2, the method of functioning of an I/Q-modulator and a frequency synthesiser will now be explained with reference to FIGS. 3 and 4.

FIG. 3 shows a conventional I/Q-modulator 2, which is used in FIG. 2. The I- and Q-components of a complex baseband signal are converted via low-pass filters 30, 31, via a pair of mixers 32, 33 and via an adder 34 into an intermediate frequency position $f_{IF}$. For this purpose, an oscillator signal $5 \cdot f_{OSZ}$ is additionally supplied to the I/Q-modulator, wherein this oscillator signal is supplied directly to one of the mixers 32, and via a 90° phase-shifter to the other mixer 33. The I- and Q-components are initially low-pass filtered in order to remove any possible harmonics of the digital/analog converter 1.

Figure 4:
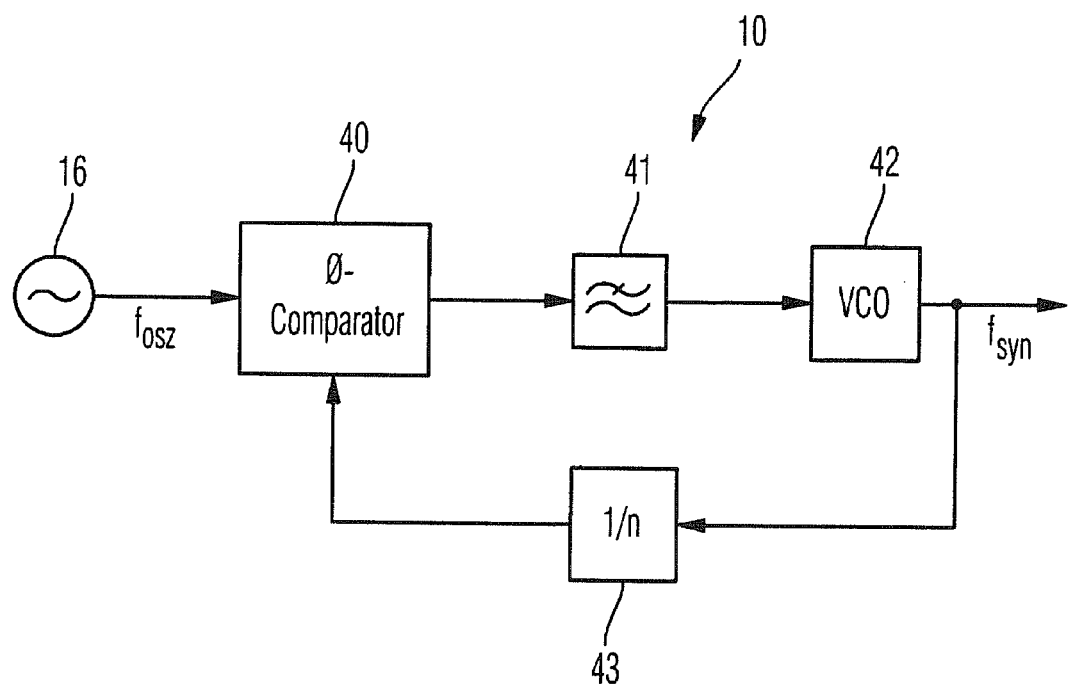
FIG. 4 shows a frequency synthesiser capable of being used within the framework of the invention.

FIG. 4 shows a conventional frequency synthesiser 10, which can be used in the circuit shown in FIG. 2. A phase comparator receives the reference frequency $f_{OSZ}$ as a first input signal. This reference frequency is compared with a signal from a variable frequency divider 43 with the division factor 1/n. A control signal, which is routed in an integrated manner via the low-pass filter 41 to the voltage-controlled oscillator 42, is provided at the output of the phase comparator 40. In general, resonating circuits with varactor diodes are used in the voltage-controlled oscillator. The varactor diodes provide a variable capacitance dependent upon the input voltage. Accordingly, the resonant frequency of the resonating circuit can be varied dependent upon the input voltage.

The invention is not restricted to the exemplary embodiments described. The circuit arrangement for signal conditioning according to the invention can be used in a versatile manner. Any of the elements described and illustrated can be combined with one another.

The invention claimed is:

1. A circuit for signal conditioning consisting of a first stage with a digital/analog converter, a second stage with an I/Q-modulator, the second stage being subsequent to the first stage, and at least one third stage with a mixer, the third stage being subsequent to the second stage,
wherein, instead of a multiplicity of independent oscillators, a shared oscillator is provided for the first, second, and third stages, from an output signal of which a respective oscillator signal and clock-pulse signal for each stage of the first, second, and third stages is derived,
wherein the oscillator signal and respective clock-pulse signal of the oscillator are supplied via a frequency divider to at least one stage of the first, second, and third stages, or wherein the oscillator signal of the oscillator is supplied via a frequency multiplier to at least one stage, and
wherein the oscillator signal of the oscillator is supplied as a reference signal to a frequency synthesizer of at least one stage of the first, second, and third stages.

2. A circuit for signal conditioning comprising:
a first stage with a digital/analog converter;
a second stage with an I/Q-modulator, the second stage being subsequent to the first stage; and
at least one third stage with a mixer, the third stage being subsequent to the second stage,
wherein, instead of a multiplicity of independent oscillators, a shared oscillator is provided for the first, second, and third stages, from an output signal of which a respective oscillator signal and clock-pulse signal for each stage of the first, second, and third stages is derived,
wherein the oscillator signal and respective clock-pulse signal of the oscillator are supplied via a frequency divider to at least one stage of the first, second, and third stages, or wherein the oscillator signal of the oscillator is supplied via a frequency multiplier to at least one stage, and
wherein the oscillator signal of the oscillator is supplied as a reference signal to a frequency synthesizer of at least one stage of the first, second, and third stages.

3. A circuit for signal conditioning comprising:
a first stage with a digital/analog converter;
a second stage with an I/Q-modulator, the second stage being subsequent to the first stage; and
at least one third stage with a mixer, the third stage being subsequent to the second stage,
wherein, instead of a multiplicity of independent oscillators, a shared oscillator, which supplies all of the first, second, and third stages with a common oscillator signal and respective clock-pulse signal, is provided for the first, second, and third stages, and
wherein an oscillator signal of the shared oscillator is supplied via a frequency multiplier to at least one stage of the first, second, and third stages.

4. The circuit for signal conditioning according to claim 3, wherein the oscillator signal of the shared oscillator is supplied as a reference signal to a frequency synthesizer of at least one stage of the first, second, and third stages.

5. A circuit for signal conditioning comprising:
a first stage with a digital/analog converter;
a second stage with an I/Q-modulator, the second stage being subsequent to the first stage; and
at least one third stage with a mixer, the third stage being subsequent to the second stage,
wherein, instead of a multiplicity of independent oscillators, a shared oscillator, which supplies all of the first, second, and third stages with a common oscillator signal and respective clock-pulse signal, is provided for the first, second, and third stages,
wherein an oscillator signal and respective clock-pulse signal of the shared oscillator are supplied via a frequency divider to at least one stage of the first, second, and third stages, and
wherein an oscillator signal of the shared oscillator is supplied via a frequency multiplier to at least one stage of the first, second, and third stages.

6. The circuit for signal conditioning according to claim 5, wherein the oscillator signal of the shared oscillator is supplied as a reference signal to a frequency synthesizer of at least one stage of the first, second, and third stages.

* * * * *